United States Patent

Ahn

[11] Patent Number: 5,560,777
[45] Date of Patent: Oct. 1, 1996

[54] APPARATUS FOR MAKING A SEMICONDUCTOR

[75] Inventor: Byung C. Ahn, Kyungki-do, Rep. of Korea

[73] Assignee: Goldstar Co., Ltd., Seoul, Rep. of Korea

[21] Appl. No.: 435,164

[22] Filed: May 5, 1995

Related U.S. Application Data

[62] Division of Ser. No. 145,110, Nov. 3, 1993, Pat. No. 5,424,103.

[30] Foreign Application Priority Data

Nov. 9, 1992 [KR] Rep. of Korea ............ 1992-20949

[51] Int. Cl.$^6$ .................................. C23C 16/00
[52] U.S. Cl. .................. 118/723 E; 156/345; 118/718; 204/298.07
[58] Field of Search .................. 118/718, 719, 118/723 E, 723 MP; 156/345; 204/298.07, 298.24, 298.33

[56] References Cited

U.S. PATENT DOCUMENTS

| | | | |
|---|---|---|---|
| 4,664,951 | 5/1987 | Doehler | 427/248.1 |
| 5,074,456 | 12/1991 | Degner | 228/121 |
| 5,366,555 | 11/1994 | Kelly | 118/719 |

*Primary Examiner*—R. Bruce Breneman
*Assistant Examiner*—Joni Y. Chang

[57] ABSTRACT

An apparatus for making a semiconductor at atmospheric pressure having a first electrode and second electrode which are adapted to receive an RF voltage to perform corona discharge, the first electrode and second electrode together forming a corona discharge chamber, a supporter for supporting a substrate below the discharge chamber, a gas supply system for supplying a reactive gas to the discharge chamber, and an exhaust system installed around the substrate supporter and the electrodes and adapted to prevent a substrate supported by the supporter from being contaminated by external air, wherein the gas supply system and gas exhaust system maintain a region above the supporter at atmospheric pressure during a corona discharge operation.

9 Claims, 4 Drawing Sheets

APPARATUS FOR MAKING A SEMICONDUCTOR

This application is a divisional of copending application Ser. No. 08/145,110, filed on Nov. 3, 1993, U.S. Pat. No. 5,424,103 the entire contents of which are hereby incorporated by reference.

The present invention relates in general to an apparatus for fabricating a semiconductor, and more particularly to an apparatus for making a semiconductor, capable of performing various processes using various gases by use of an inexpensive equipment utilizing corona discharge at atmospheric pressure.

BACKGROUND OF THE INVENTION

Hereinafter, conventional fabrication methods are to be described with reference to a few drawings for better understanding of the background of the invention.

FIG. 1 shows schematically a conventional hydrogen plasma treatment apparatus. As shown in this figure, the conventional apparatus comprises a vacuum chamber 1 in which an external RF power source 2 enables a pair of cathodes 3 to generate a radio frequency, and an anode that consists of a substrate 4 supported by a supporter 5 are provided.

In the apparatus, a gas supply system 6 which supply hydrogen ($H_2$) gas to the space between the pair of cathodes of the vacuum chamber 1 is set at the exterior of the chamber to control the quantity of hydrogen whereas an exhaust system 7 which appropriately maintains the pressure of the vacuum chamber 1 at working pressure is set at one side of the chamber.

Description for the processings with the above-mentioned hydrogen plasma treating apparatus will be given next.

Hydrogen ($H_2$) gas is supplied in the quantity of approximately 10 to 500 sccm into the vacuum chamber 1 in proportional to the size of the substrate 4 or the vacuum chamber 1. While the temperature of the substrate is maintained in a range of approximately 250° to 350° C., reaction pressure is kept in the range of a vacuum of approximately 0.1 to 1 torr by controlling the exhaust system 7.

Under such conditions, the power which is supplied to the vacuum chamber in the quantity of approximately 0.05 to 1 W/cm$^2$ from the RF power source 2 forces the hydrogen ($H_2$) to be separated into plasma which is then diffused into a semiconductor film on the substrate 4, resulting in the hydrogenation of the semiconductor film. At this time, the control of the apparatus is determined by the concentration of hydrogen radical (separated into plasma) on the surface of the substrate 4 and the hydrogen diffusion rate which is dependent on the substrate temperature.

Turning now to FIG. 2, there is shown another conventional apparatus for semiconductor hydrogenation treatment, which employs light for the hydrogenation. As shown in this figure, this apparatus comprises a chamber 1 in which a substrate 4 supported by a substrate supporter 5 is provided in a lower portion, a gas supply system supplying gas such as $H_2$ or Hg in a constant quantity, an exhaust system 7 keeping the degree of vacuum within the chamber 1 constant, dependent on the working of a vacuum pump, a quartz window 8 mounted on the upper portion of the chamber, and a low pressure mercury lamp 9 illuminating the chamber through the quartz window 8.

In such apparatus, hydrogen ($H_2$) and mercury (Hg) gases are, at the same time, supplied from the gas supply system 6 into the vacuum chamber 1 at constant flow rates, respectively. Illumination using ultraviolet rays with wavelengths of 184.9 and 254 nm causes Hg electrons to enter to an excited state (Hg$^*$) which, in turn, decomposes $H_2$ gas into radicals. The hydrogen radicals diffuse into a semiconductor film on the substrate 4 to hydrogenate it. The apparatus is controlled by the concentration of hydrogen radical on the surface of the substrate and the hydrogen diffusion rate which is dependent on the substrate temperature. The $H_2$ concentration is determined by the partial pressures of $H_2$ and Hg within the vacuum chamber 1.

The conventional apparatuses for the treatment of semiconductor hydrogenation and methods according to the same show problems as follows: first, since the hydrogenation processes are carried out within the vacuum chamber 1, an exhaust system must be required; second, accordingly, the high cost of equipment is needed due to the high priced chamber and the exhaust system; third, the time for treating the substrate is lengthened because processes are carried out in a vacuum state; fourth, if the apparatus shown in FIG. 1 is used in a of a process which is mainly performed under atmospheric, pressure time needed to form a vacuum within the vacuum chamber becomes a factor that lowers the productivity; fifth, since the apparatus described with reference to FIG. 2 uses mercury (Hg), there occurs pollution problems; sixth, in case that a large substrate is made, it is required to make the quartz window 9 passing the light irradiated from the low pressure mercury lamp 9 large as well; and finally, since the low pressure mercury lamp is unable to uniformly large area, it is difficult to make semiconductors with high quality.

SUMMARY OF THE INVENTION

Therefore, an object of the present invention is to solve the aforementioned problems encountered in the prior art and to provide a method for making a semiconductor which is capable of consistently producing semiconductors in mass and improving the productivity, along with an apparatus for the method.

According to an aspect of the present invention, this object can be accomplished by providing a method for making a semiconductor which comprises the steps of: supplying a reactive gas to, at least, one electrode capable of generating corona discharge above a substrate with an RF power source under atmospheric pressure; irradiating ions or radicals resulted from the decomposition of said reactive gas by said corona discharge to said substrate; allowing said ions or radicals to be chemically reacted with said substrate or to be diffused in said substrate.

According to another aspect of the present invention, this object cab be accomplished by providing an apparatus comprised of: at least one electrode installed above a substrate supporter, said electrode generating corona discharge with an RF power source; a gas supply system supplying a reactive gas to said electrode; an exhaust system installed around said substrate support and said electrode, said exhaust system preventing the substrate from being contaminated by external air.

The above and other objects and advantages of the present invention will become more apparent as the following description proceeds.

To the accomplishment of the foregoing and related ends, the invention comprises the features hereinafter fully described in the specification and particularly pointed out in claims. The following description and the annexed drawing setting forth in detail a certain illustrative embodiment of the invention is not intended to be limitive. Rather it is but one of the various ways in which the principles of the invention may be employed.

DETAILED DESCRIPTION OF THE INVENTION

Figure 1:
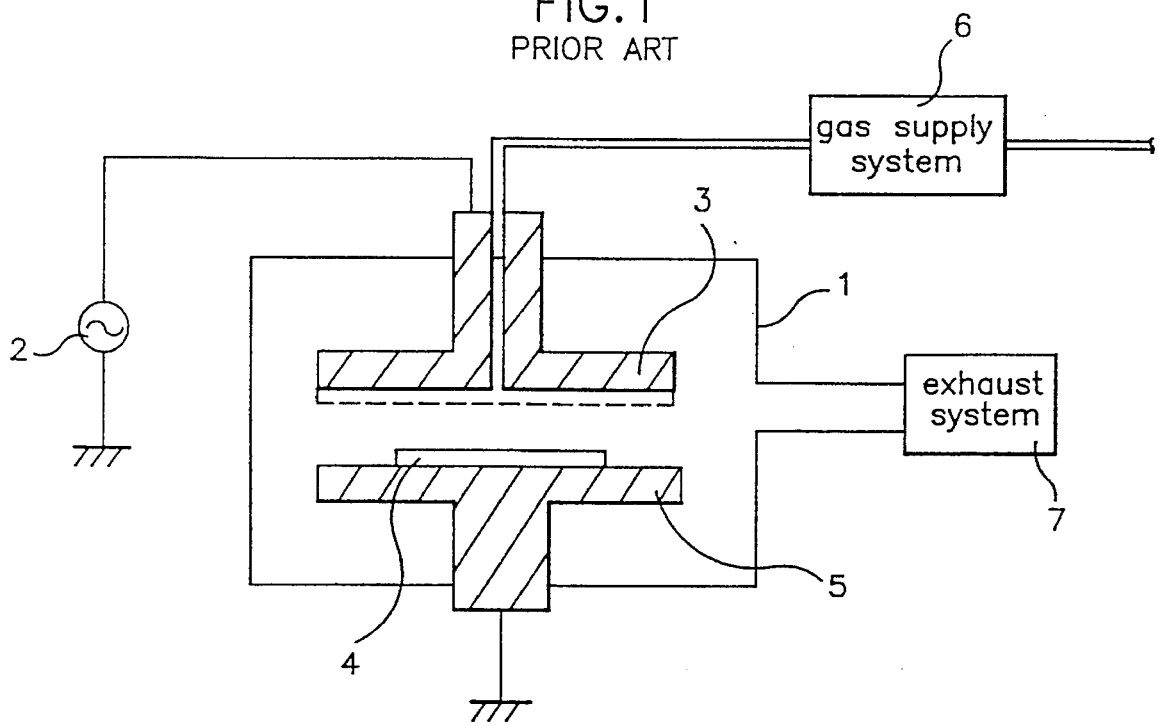
FIG. 1 is a schematic sectional view illustrating a conventional apparatus for hydrogenating semiconductor.
Figure 2:
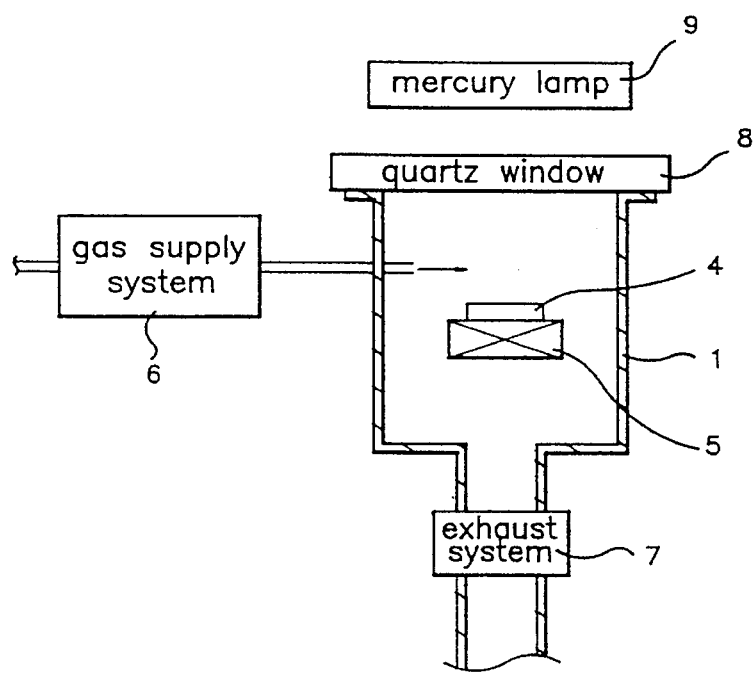
FIG. 2 is a schematic sectional view illustrating another conventional apparatus for hydrogenating semiconductor.
Figure 3A:
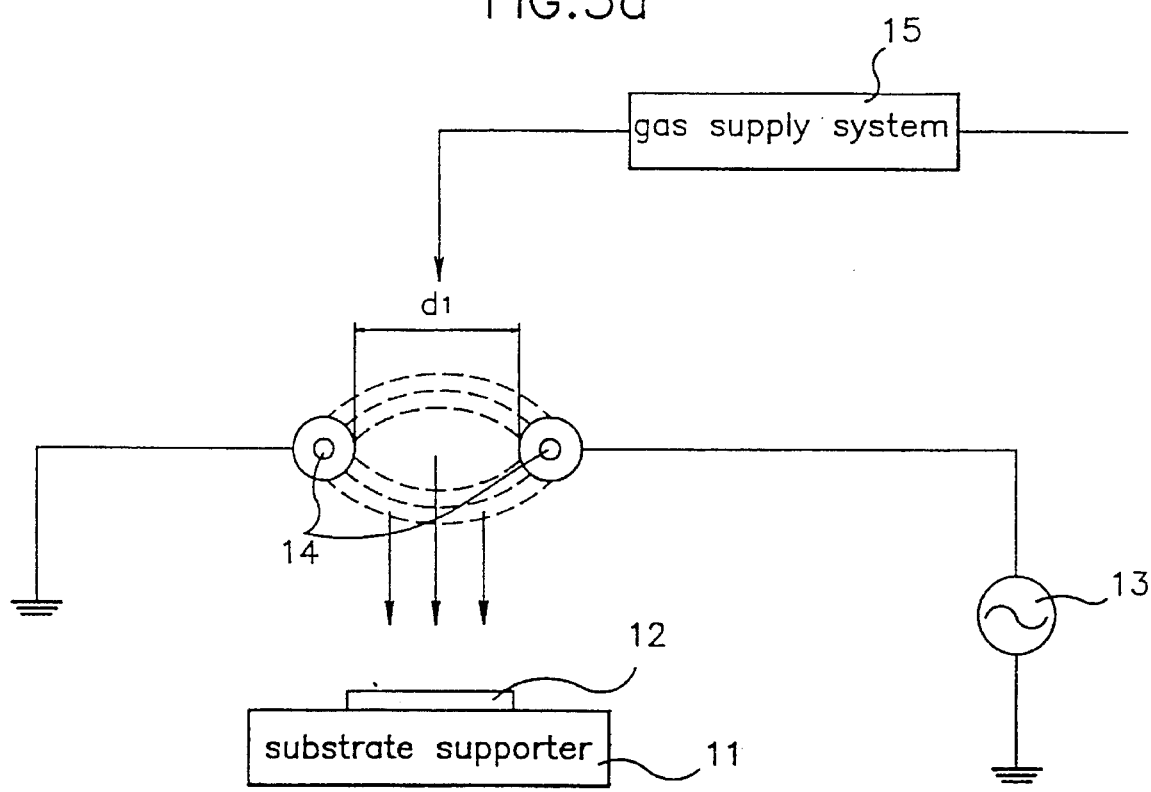
FIGS. 3a and 3b are schematic views explaining a semiconductor treatment apparatus in accordance with the present invention.
Figure 3B:
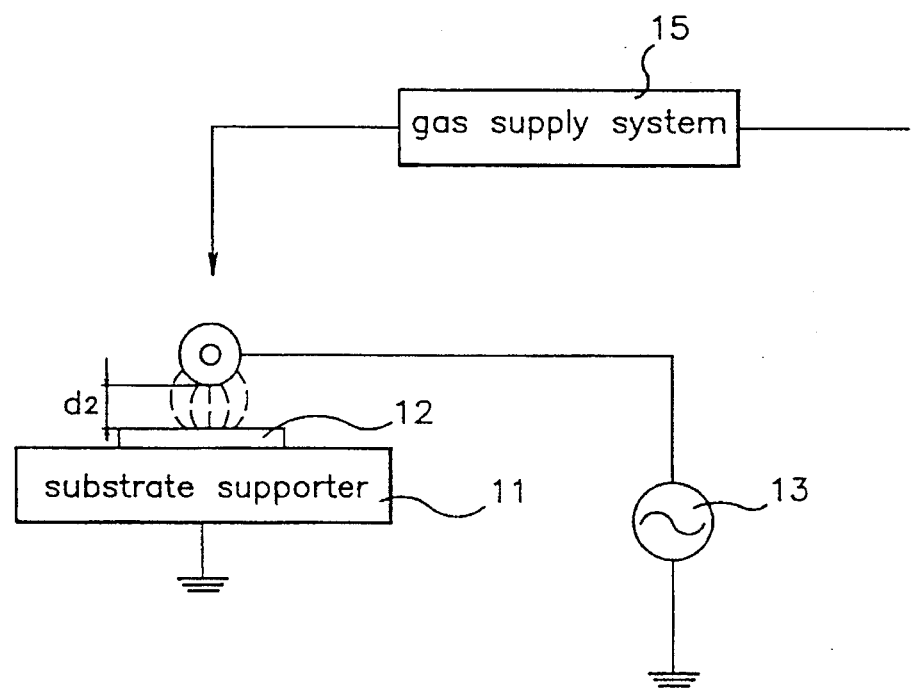

Hereinafter, preferred embodiments of the present invention will be described in detail with reference to several drawings wherein like reference numerals designate like parts. FIG. 3 schematically shows a semiconductor treatment apparatus according to the present invention. As shown in the figure, the apparatus according to the present invention comprises a substrate supporter 11 supporting a substrate 12 thereon and heating it at a constant temperature, an RF power source 13 applying RF electric power so as to generate a corona discharge, at least an electrode 14 connected with the RF power source and a gas supply system 15. For treating the substrate, above the substrate supporter 11 supporting the substrate 12 thereon, are provided a pair of electrodes 14 which are connected with the RF power source 13 and ground, respectively, as shown in FIG. 3A. Alternatively, only an electrode 14 is provided which is connected with the RF power source 13, while the substrate supporter 11 supporting the substrate 12 is grounded, as shown in FIG. 3B. In any cases, application of the RF power source generates a corona discharge between a pair of electrodes 14, or the electrode 14 and the substrate support 11.

In the state that the corona discharge occurs, a reactive gas selected from the group consisting of $H_2$, $O_2$, $SiH_4$, $SiF_4$, $Si_2H_6$, $GeH_4$, $Ge_2H_6$, $He$, $Ar$, $O$, $CF_4$, $SF_6$, $CH_2F_2$, $NF_3$, $CCl_2F_2$, $Cl_2$, $CCl_4$, $WF_6$, $2MOCl_5$, $Cr[C_6H_5CH(CH_3)_2]_2$, $Al(C_4H_9)_3$ is supplied from the gas supply system into the upper region of the electrode 14. The electrons Which are exited between a pair of the electrodes 14 make the molecules of the reactive gas become ions and radicals with high energies. The ions and radicals with high energies which are generated by the corona discharge cause chemical reaction or diffusion on the surface of a semiconductor.

Such processes are performed at atmospheric pressure. While the processes proceed, it is preferred to supply nitrogen ($N_2$) to the surrounds of the electrode 14 in order to prevent the substrate from being contaminated with other gases (the air) besides the reactive gas.

The electrode used in the present invention includes a high melting metal such as W, Ta and the like and is subjected to surface treatment by use of MgO or $SiO_2$.

The R.F. power source used in the present invention employs a high frequency power source of above 100 KHz in order to prevent arc discharge and to constantly generate a corona discharge.

An field which is generated by the power source and determined by the distance $d_1$ between the electrodes 14 or the distance $d_2$ between the electrode 14 and the substrate 12, is preferably above 1 KV/mm (for example, $d_1$, $d_2$=5, 5KV).

Figure 4:
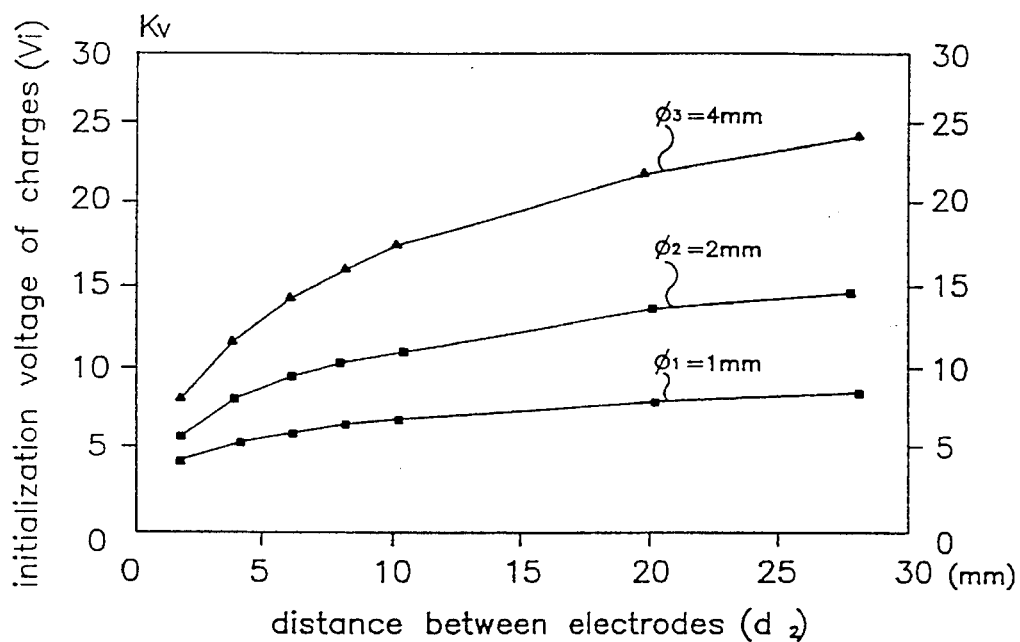
FIG. 4 is a graph of a relation between the inter-electrode distance and the discharge initiation voltage in accordance with the present invention.

Referring now to FIG. 4, there is shown dependency of initialization voltage of charge (Vi) on the distance $d_2$ between electrodes of FIG. 3B. From the curves for different diameter cases, that is, $\phi_1$=1 mm, $\phi_2$=2 mm, $\phi_3$=4 mm, it is found that Vi is in proportional to log $d_2$. In addition, as the diameter of the electrode is made small, the Vi value becomes reduced.

For example, using a high frequency power source with a frequency of 80 KHz, discharge is initialized at 6 KV in the apparatus of FIG. 3A under such a condition that the electrode is made of a tungsten line enveloped with melted $SiO_2$, where the distance $d_1$ is 2 mm and hydrogen is supplied in the quantity of 200 sccm.

Figure 5:
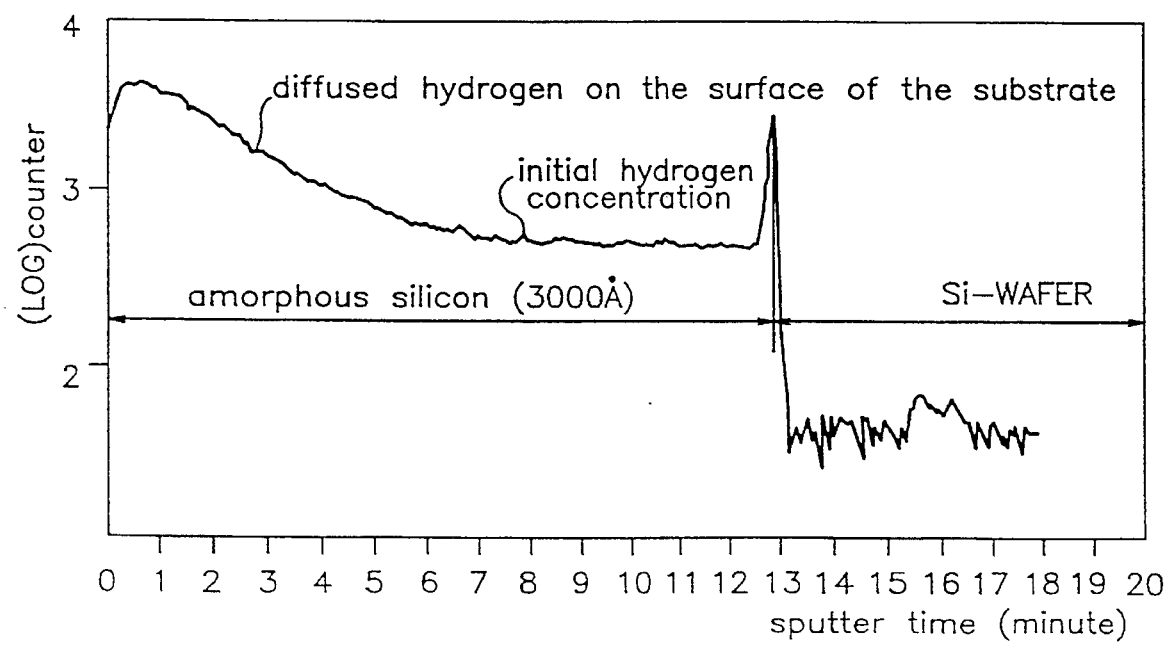
FIG. 5 is an analysis graph of a hydrogen distribution in a silicon wafer formed with an amorphous silicon film and hydrogenated in accordance with the present invention.

Turning now to FIG. 5, there is shown a profile illustrating the distribution state of hydrogen within an amorphous silicon film which is formed on a silicon wafer (substrate) in a thickness of 3,000 Å by low pressure chemical vapor deposition (LPCVD), heated to 350 ° C., and then, treated at 8 KV for 30 minutes according to the present invention. From the profile, it is apparent that the $H_2$ concentration within the surface is at least 8 times as much as the initial concentration. In addition, since the concentration of hydrogen according to the depth of the amorphous silicon is profiled as an error function, the substrate is hydrogenated by the hydrogen diffusion dependent on the substrate temperature.

Figure 6A:
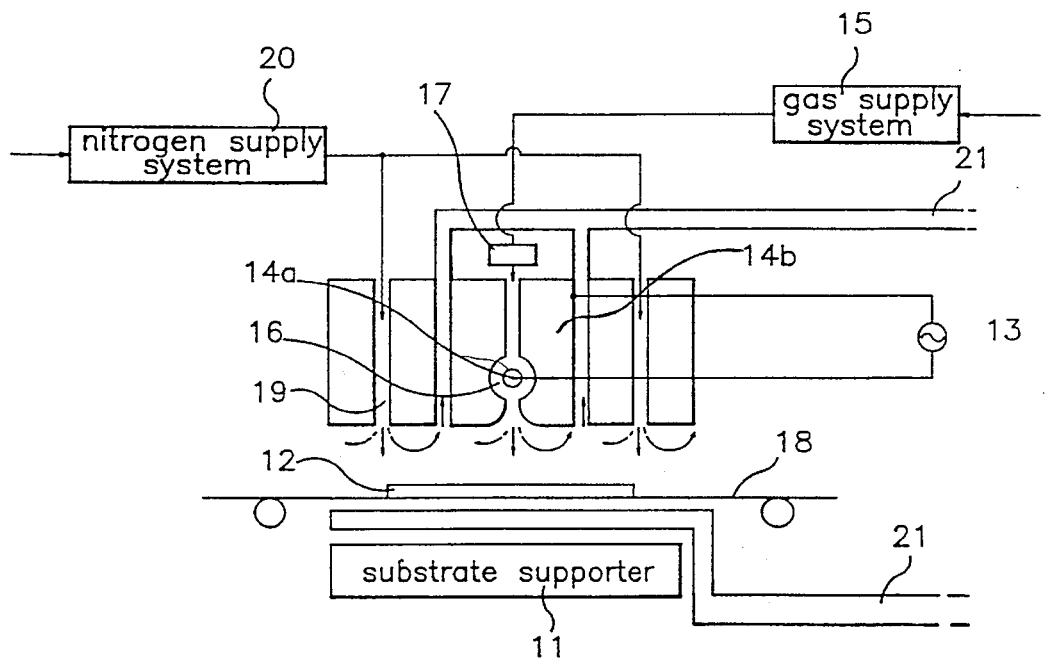
FIGS. 6a and 6b are a sectional view and a cross-sectional view illustrating a semiconductor treatment apparatus in accordance with an embodiment of the present invention.
Figure 6B:
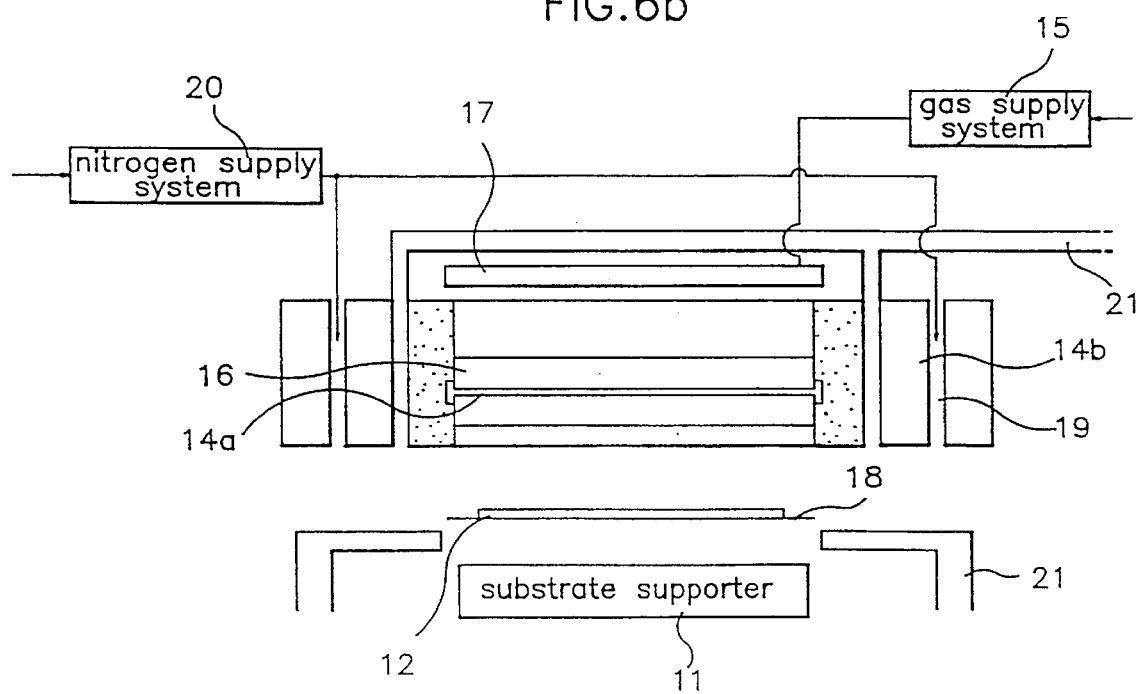

A preferred embodiment is to be described with reference to FIGS. 6a and 6b. In accordance with the present invention, a semiconductor thin film formed on a large sized insulating film is capable of being treated in sequence under atmospheric pressure. An electrode which causes corona discharge is comprised of a first electrode 14a and a second electrode 14b. The first electrode 14a which is made of a metal selected from the group consisting of W, Nb, Ta and Mo is coated with a metal oxide film selected from the group consisting of $Ta_2O_5$, $Nb_2O_5$, $SiO_2$ and MgO, and the surface of the second electrode is treated as well with a metal oxide film. The second electrode 14b is formed in the outside of the first electrode 14a in such a way to provide, at least, a discharge chamber 16 which has a tube shape and extends in an X direction. The first electrode 14a is shaped as a line or a bar and has a diameter of at least 1 mm. A reactive gas is supplied into the space between the first electrode 14a and the second electrode 14b, that is, the discharge chamber 16 by a gas supply system 15 which also controls the flow rate so as to supply the gas at a constant quantity.

A diffuser 17 is provided at an upper portion of the discharge chamber 16, which plays a role in supplying the reactive gas more uniformly.

An RF power source 13 used in the apparatus according to the present invention employs an AC voltage that has a maximum level of 20 KV at 80 KHz. The RF power source 13 is connected between the first electrode 14a and the second electrode 14b.

Ions and radicals with high energies which result from the decomposition of the reactive gas are passed through a nozzle which has a taper slit shape.

A substrate 12 is laid on a timing belt 18 which is disposed above a substrate supporter 11 and fed to the substrate supporter 11, followed by heating of the substrate 12 to a predetermined temperature. The processing degree is controlled by the flow rate of reactive gas, the discharge voltage, the feed speed, and the heating temperature of the substrate temperature. Nitrogen ($N_2$) gas is supplied to the exterior of substrate 12 in order to prevent the reactive gas from being leaked and to protect the apparatus from being contaminated with the air. The nitrogen gas is supplied from a nitrogen supply system 20 via a nitrogen inlet 19 so that the leakage of the reactive gas and the contamination of the substrate can be prevented. Exhaust systems 21 which exhaust the reactive gas are placed above the timing belt 18 and at the outside thereof. Unreacted gas may pollute the air and thus it, is not exhausted until it is oxidized with oxygen.

The dependence of the production process on the kind of the reactive gas will be further described with reference to specific examples.

EXAMPLE 1

A process for Dopping Impurities in a Wafer

Instead of hydrogen gas as preferably used in the present invention, phosphine ($PH_3$), diborane ($B_2H_5$) and arsine ($AsH_3$) gas containing 3 or 5 valence elements which are gases for dopping semiconductor impurity were supplied to the discharge chamber 16 via the gas supply system 15 and the diffuser 17, decomposed by means of corona discharge, and diffused in the semiconductor thin film on the surface of the substrate 12 to give an n type or p type semiconductor.

As compared with a conventional semiconductor dopping method whereby ions are diffused at a high temperature to be implanted, the method according to the present invention whereby 3 or 5 valence elements to be decomposed with a high energy are irradiated to the substrate under the atmosphere allows a large-sized substrate including a semiconductor thin film to be treated with impurities on a large scale.

EXAMPLE 2

A process for Washing a Surface and Removing a Polymer Film

Instead of hydrogen ($H_2$) gas as preferably used in the present invention, oxygen ($O_2$) gas was decomposed to irradiate oxygen ions and radicals with high energies to the surface of the substrate 12.

The oxygen ions and radicals with high energies react with the organic materials remaining on the surface of the substrate 12 so as to oxidize and remove them.

Such process is applicable to an ashing process which is for removing a photoresist film and is capable of being carried out in a large scale by using high energy oxygen ions and radicals under atmospheric pressure, as compared with a conventional dry etch or UV ashing process.

EXAMPLE 3

A process for Forming Semiconductor a Film

Instead of hydrogen ($H_2$) gas as preferably used in the present invention, silane gases ($SiH_4$, $Si_2H_6$, $SiF_4$) was decomposed by means of corona discharge to irradiate the silane ions and radicals with high energies to the surface of the substrate 12. As a result, an amorphous silicon film or a polysilicon film was formed.

While the conventional apparatus for forming a semiconductor film is comprised of a high priced vacuum installation, the inventive apparatus is capable of being carried out for forming a semiconductor film in sequence under atmospheric pressure.

EXAMPLE 4

A process for Forming an Insulating Film

Instead of hydrogen ($H_2$) gas as preferably used in the present invention, silane gases ($SiH_4$, $Si_2H_6$, $SiF_4$) were used in admixture with oxidative gases ($O_2$, $N_2O$) or a gas for nitride film ($NH_3$) w to form a silicon oxide film and a silicon nitride film.

Also, instead of the silane gases, a reactive gas containing various metals such as $WF_6$, $2MoCl_5$, $Cr[C_6H_5CH(CH_3)_2]_2$ and $Al(C_4H_9)_3$ was admixed with an oxidative gas or a gas for nitride film to form a metal oxidative gas or metal nitride film.

EXAMPLE 5

A Dry Etch Process

Instead of hydrogen ($H_2$) gas as preferably used in the present invention, a gas for a dry etch, such as $CF_4$, $NF_3$, $CH_2F_2$, $SF_6$, $CCl_2F_2$ was decomposed by means of a corona discharge to irradiate the gas ions and radicals with high energies onto the surface of the substrate 12. As a result, the inventive process allows a dry etch process to be applied to a metal film, semiconductor film and insulating film.

As described hereinbefore, gases selected for desirable purposes can be decomposed by means of corona discharge to irradiate the ions and radicals of the gas to a substrate surface, resulting in chemical reactions or diffusion of the ions and radicals at atmospheric pressure in accordance with the present invention. Accordingly, a large-sized substrate can be treated with improved efficiency according to the present invention. In addition, the apparatus according to the present invention can be used in a process that is carried out under atmospheric pressure, thereby enabling a total production process to proceed in sequence and bringing about such an effect that semiconductors are consistently produced in mass.

What is claimed is:

1. An apparatus for making a semiconductor which provides for a corona discharge processing at atmospheric pressure, comprising:

a first electrode and second electrode, one of the first electrode and the second electrode being adapted to receive an RF voltage to perform a corona discharge, and the first electrode and second electrode forming a discharge chamber therebetween;

a supporter, installed below the first electrode and the second electrode, for supporting a substrate;

a gas supply system for supplying a reactive gas to said one electrode and an exhaust system installed around said first and second electrodes, said gas supply system and said exhaust system being adapted to maintain the region above the substrate at atmospheric pressure during a corona discharge operation to thereby prevent a region above the substrate from being contaminated by external air during the corona discharge operation.

2. An apparatus according to claim 1, wherein said first electrode is made of a metal selected from the group consisting of W, Nb, Ta, and Mo.

3. An apparatus according to claim 1, wherein said second electrode is provided at its surface with a metal oxide film.

4. An apparatus according to claim 1, wherein said first electrode is coated at its surface with metal oxide film selected from the group consisting of $Ta_2O_5$, $Nb_2O_5$, $SiO_2$ and MgO.

5. An apparatus according to claim 1, wherein said first and second electrodes are arranged such that the second electrode surrounds the first electrode to define a space therebetween, said space constituting said discharge chamber.

6. An apparatus according to claim 5, wherein said gas supply system has a diffuser for uniformly distributing said reactive gas in an upper portion of said discharge chamber.

7. An apparatus according to claim 1, further comprising a timing belt disposed above said supporter and adapted to continuously feed substrates so as to be processed by said apparatus.

8. An apparatus according to claim 2, wherein said second electrode is provided at its surface with a metal oxide film.

9. An apparatus according to claim 2, wherein said first electrode is coated at its surface with a metal oxide film selected from the group consisting of $Ta_2O_5$, $Nb_2O_5$, $SiO_2$ and MgO.

* * * * *